US006950176B1

(12) United States Patent
LaFontaine et al.

(10) Patent No.: US 6,950,176 B1
(45) Date of Patent: Sep. 27, 2005

(54) METHOD AND SYSTEM FOR MONITORING EUV LITHOGRAPHY MASK FLATNESS

(75) Inventors: Bruno M. LaFontaine, Pleasanton, CA (US); Ivan Lavolic, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/755,658

(22) Filed: Jan. 12, 2004

(51) Int. Cl.[7] .......................... G03B 27/62; G03B 27/58
(52) U.S. Cl. .......................................... 355/75; 355/72
(58) Field of Search ............................. 355/53, 72–75, 355/30; 430/5, 20, 30; 378/35

(56) References Cited

U.S. PATENT DOCUMENTS

| | | | | |
|---|---|---|---|---|
| 4,666,291 A | * | 5/1987 | Taniguchi et al. ............. | 355/52 |
| 5,442,163 A | * | 8/1995 | Nakahara et al. ............ | 235/381 |
| 5,872,694 A | * | 2/1999 | Hoinkis et al. .............. | 361/234 |
| 6,353,271 B1 | | 3/2002 | Williams | |
| 6,537,844 B1 | * | 3/2003 | Itoh ............................ | 438/48 |
| 6,597,434 B2 | * | 7/2003 | Van Dijsseldonk ........... | 355/75 |

FOREIGN PATENT DOCUMENTS

JP     2001-92155     *  4/2001

OTHER PUBLICATIONS

Briefing: EUV Mask Chucking Standards [online]. Retrieved from the Internet: <URL: http://www.sematech.org/public/resources/litho/euvl/euvlmask030702/1-Agenda.pdf>, EUVL, pp. 1-29.
Surface Flatness Measurements [online] [retrieved on Jul. 9, 2003]. Retrieved from the Internet: >URL: http://www.phase-shift.com/interferometer-flatness.html>.
Specifications Guide, 4810 Non-Contact Capacitance Gaging Instrument, Copyrighted 2002, ADE Technologies.
Specifications Guide, Microsense II—5810, Non-Contact Capacitance Gaging Module, Copyrighted 2002, ADE Technologies.

* cited by examiner

Primary Examiner—Henry Hung Nguyen
(74) Attorney, Agent, or Firm—Renner, Otto, Boisselle & Sklar, LLP

(57) ABSTRACT

Disclosed are a method of and a system for monitoring extreme ultraviolet (EUV) lithography mask flatness. An EUV mask, which is chucked to a chuck, can be scanned with a capacitance probe that generates elevation data for the EUV mask. From the elevation data, a first flatness profile can be generated. In one embodiment, the EUV mask can be rotated and rescanned.

10 Claims, 2 Drawing Sheets

METHOD AND SYSTEM FOR MONITORING EUV LITHOGRAPHY MASK FLATNESS

TECHNICAL FIELD

The present invention relates generally to the field of integrated circuit manufacture and, more particularly, to a method and a system for monitoring the flatness of an extreme ultraviolet (EUV) lithography mask.

BACKGROUND

The formation of various integrated circuit (IC) structures on a wafer often relies on lithographic processes, sometimes referred to as photolithography, or simply lithography. For instance, patterns can be formed from a photo resist layer by passing light energy through a mask (or reticle) having an arrangement to image the desired pattern onto the photo resist layer. As a result, the pattern is transferred to the photo resist layer. In areas where the photo resist is sufficiently exposed and after a development cycle, the photo resist material can become soluble such that it can be removed to selectively expose an underlying layer (e.g., a semiconductor layer, a metal or metal containing layer, a dielectric layer, etc.). Portions of the photo resist layer not exposed to a threshold amount of light energy will not be removed and serve to protect the underlying layer. The exposed portions of the underlying layer can then be etched (e.g., by using a chemical wet etch or a dry reactive ion etch (RIE)) such that the pattern formed from the photo resist layer is transferred to the underlying layer. Alternatively, the photo resist layer can be used to block dopant implantation into the protected portions of the underlying layer or to retard reaction of the protected portions of the underlying layer. Thereafter, the remaining portions of the photo resist layer can be stripped.

There is a pervasive trend in the art of IC fabrication to increase the density with which various structures are arranged. As a result, there is a corresponding need to increase the resolution capability of lithography systems. One promising alternative to conventional optical lithography is a next-generation lithographic technique known as extreme ultraviolet (EUV) lithography where wavelengths in the range of about 11 nm to about 14 nm are used to expose the photo resist layer. For example, using a numerical aperture of about 0.25, a wavelength of about 13.4 nm and a $k_1$ value of about 0.6, it has been proposed that a resolution of about 32 nm can be achieved.

However, attempts to implement EUV lithography have encountered a number of challenges. For example, mask non-flatness can result in unacceptable overlay errors. As is known in the art, overlay relates the lateral positioning between layers comprising an integrated circuit. If the layers are not properly aligned with each other, the performance of the devices of the integrated circuit can be compromised. In this situation, it is likely that the integrated circuit, if not the entire wafer (upon which multiple integrated circuits may be fabricated), may be unusable.

Accordingly, there exists a need in the art for techniques and systems for monitoring EUV lithography mask flatness.

SUMMARY OF THE INVENTION

According to one aspect of the invention, the invention is directed to a method of monitoring flatness of an extreme ultraviolet (EUV) lithography mask. The method can include chucking the EUV mask to a chuck; scanning the EUV mask with a capacitance probe to generate a first elevation data set for the EUV mask; and generating a first flatness profile using the first elevation data set.

According to another aspect of the invention, the invention is directed to a method of monitoring flatness of an extreme ultraviolet (EUV) lithography mask. The method can include chucking the EUV mask to a chuck; scanning the EUV mask to generate a first flatness profile; removing the EUV mask from the chuck; rotating the EUV mask with respect to the chuck; rechucking the rotated EUV mask to the chuck; and rescanning the rotated EUV mask to generate a second flatness profile.

According to yet another aspect of the invention, the invention is directed to a system for monitoring flatness of an extreme ultraviolet (EUV) lithography mask. The system can include a mask platen assembly including a chuck with a mask mounting surface for receiving the EUV mask and electrostatically retaining the EUV mask to the chuck; a capacitance probe for scanning the EUV mask to generate elevation data for the EUV mask; and a controller for receiving the elevation data and generating a flatness profile using the elevation data and for controlling the electrostatic clamping forces of the mask platen assembly.

BRIEF DESCRIPTION OF DRAWINGS

These and further features of the present invention will be apparent with reference to the following description and drawings, wherein.

DISCLOSURE OF INVENTION

Figure 1:
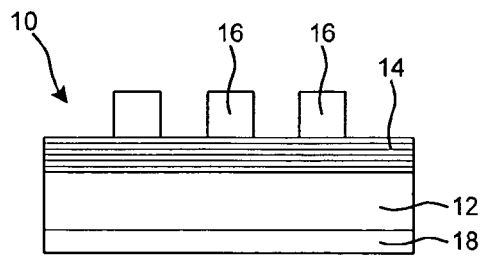
FIG. 1 is a partial schematic cross-section of one embodiment of an extreme ultraviolet (EUV) lithography mask.

In the detailed description that follows, similar components have been given the same reference numerals, regardless of whether they are shown in different views and/or embodiments. To illustrate the various aspects of the present invention(s) in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

The description herein is presented in the exemplary context of fabricating a wafer having an integrated circuit (IC) formed thereon. Example ICs include general purpose microprocessors made from thousands or millions of transistors, a flash memory array or any other dedicated circuitry. However, one skilled in the art will appreciate that the methods and devices described herein can also be applied to the fabrication of any article manufactured using lithography, such as micromachines, disk drive heads, gene chips, micro electro-mechanical systems (MEMS) and so forth.

The apparatus and methods described herein can provide for detection of a key parameter for extreme ultraviolet (EUV) lithography. Namely, EUV mask flatness can be monitored to determine if conditions are favorable for carrying out operations associated with the EUV mask, such as, illuminating a wafer with an illumination pattern defined by the EUV mask, inspecting the EUV mask (e.g., in a registration metrology tool) and/or fabricating an EUV mask using a mask writer assembly. As should be appreciated, the term reticle may be used interchangeably with the term mask.

Turning initially to FIG. 1, an EUV lithography mask 10 is illustrated. The mask can include a glass substrate 12, such as quartz glass (e.g., $SiO_2$) or BPSG. A multilayer reflector film stack 14 can be formed (e.g., by deposition) over or on an upper surface of the substrate 12. The multilayer stack 14 can be made from alternating layers of high-Z and low-Z materials, such as molybdenum and silicon layers (Mo/Si), molybdenum carbon and silicon layers ($Mo_2C$/Si), molybdenum and beryllium layers (Mo/Be), or molybdenum ruthenium and beryllium layers (MoRu/Be). Together, the substrate 12 and multilayer stack 14 can form a mask blank.

To function as an EUV lithography mask, absorbing material can be deposited and patterned on the multilayer stack 14 to form a plurality of absorbers 16. Although the absorbers 16 are illustrated as individual structures, the absorbers 16 can form an interconnected pattern. A buffer layer (not shown) can be formed between the multilayer stack 14 and the absorbing material 16 to facilitate etching of the absorbing material with minimal damage to the multilayer stack 14. The absorbers can be made from chromium (Cr), titanium nitride (TiN), tantalum nitride (TaN) or other suitable material.

Figure 2:
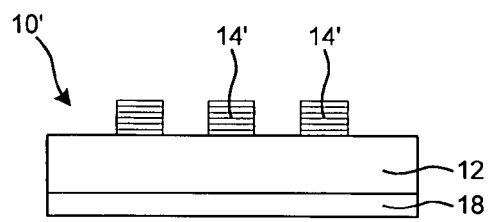
FIG. 2 is a partial schematic cross-section of another embodiment of an EUV lithography mask.

Alternatively, as shown in FIG. 2, a functional EUV lithography mask 10' can be formed by patterning the multilayer stack 14 of the mask blank to form a plurality of individual or interconnected multilayer reflectors 14'.

The mask 10 or 10' can include a conductive layer 18 disposed on a bottom surface (or backside) of the substrate 12. The conductive layer 18 can be made from a material such as chromium, silicon, or titanium nitride. The conductive layer 18 provides a conductive plane to allow the mask 10 or 10' to be electrostatically clamped to a mask stage platen (also referred to herein as a chuck).

Figure 3:
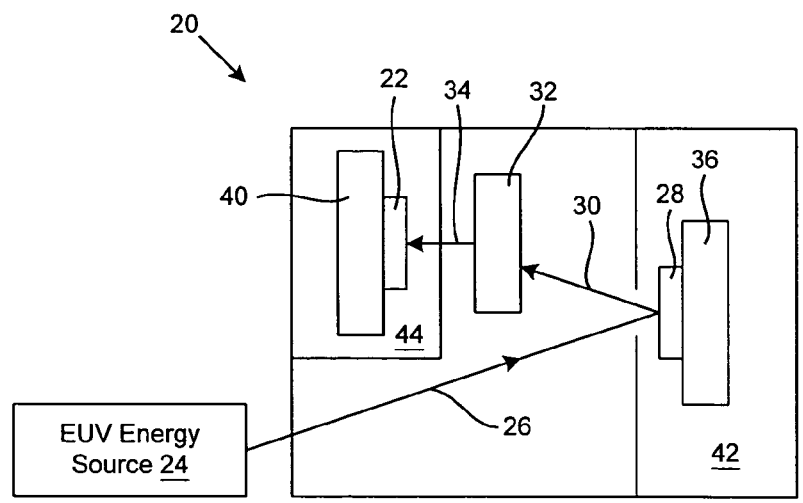
FIG. 3 is a schematic block diagram of an example integrated circuit processing arrangement.

Referring now to FIG. 3, illustrated is a schematic block diagram of an exemplary IC processing arrangement that includes an extreme ultraviolet (EUV) lithography system 20 used to image a pattern onto a wafer 22, or a region of the wafer 22. The general arrangement of the system 20 is relatively well known in the art and will not be described in great detail. The system 20 can include a EUV energy source 24 for directing EUV energy 26 towards an EUV mask 28, such as the mask 10 or the mask 10'. The EUV energy source 24 can include, for example, an x-ray emitter (e.g., a synchrotron or a laser plasma source) to direct x-rays into a condenser that, in turn, emits the EUV energy 26. The EUV energy can have a wavelength of about 11 nm to about 14 nm, and in one embodiment, the wavelength can be about 13.4 nm.

The mask 28 selectively reflects EUV energy 26 such that an EUV energy pattern 30 defined by the mask 28 is transferred towards the wafer 22. An imaging subsystem 32, such as a stepper assembly or a scanner assembly, sequentially directs the pattern 28 reflected by the mask 28 to a series of desired locations on the wafer 22 in the form of an exposure pattern 34.

Figure 4:
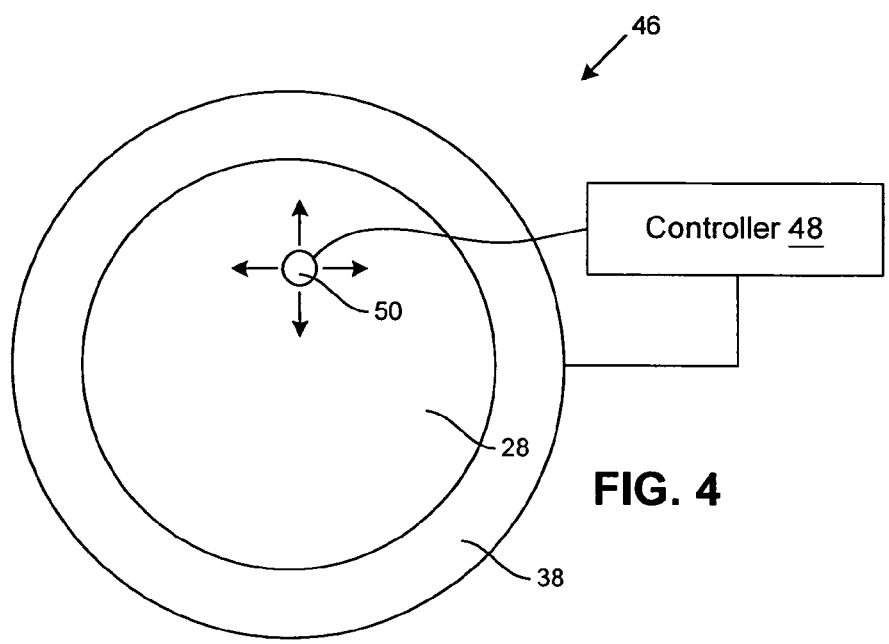
FIG. 4 is a schematic block diagram of an example EUV lithography mask flatness monitoring system.

The mask 28 can be retained by an electrostatic mask platen assembly 36 that includes an electrostatic chuck 38 (FIG. 4). Similarly, the wafer 22 can be retained by a wafer stage platen-assembly 40. In one embodiment, the assemblies 36, 40 can be housed in separate chambers. The assembly 36 and mask 28 can be housed in a mask chamber 42 that can be maintained at sub-atmospheric pressure (e.g., between about 1 mTorr to about 100 mTorr). The assembly 40 and wafer 22 can be housed in a wafer chamber 44 that is maintained at a pressure of below about 100 mTorr. The chamber 44 can include a window (not shown) through which the exposure pattern 34 passes. The remaining elements (e.g., the imaging subsystem 32) can be housed in one or more chambers that are kept, for example, in vacuum to minimize attenuation of the EUV radiation.

In general, the upper surface of the mask 28 faces the upper surface of the wafer 22. In one embodiment, the mask 28 is inverted such that it is pulled downward by gravity, but maintained in contact with the chuck 36 by clamping forces (e.g., electrostatic charges). Alternatively, the mask 28 could be held in place by a vacuum chuck.

In one embodiment, the mask platen assembly 36 can manipulate the electrostatic clamping forces between the chuck 38 and the mask 28. For example, non-uniform clamping force can be established from location to location with respect to the mask 28. Accordingly, a higher clamping force may be applied to one point or region of the mask 28 than to a second point or region of the mask 28.

Referring now to FIG. 4, shown is a schematic block diagram of an example EUV lithography mask flatness monitoring system 46. The monitoring system 46 can include a controller 48 and a probe 50. The controller 48 can be, for example a general purpose or dedicated computer system for executing logic instructions (e.g., in for the form of software or code) consistent with the functions described herein. Among other functions of the controller 48, the controller 48 can be programmed to adjust the clamping forces of the mask platen assembly 36. The probe 50 can be, for example, a non-contact capacitance gauging instrument. Satisfactory capacitance gauges are available from ADE Technologies, 77 Rowe Street, Newton, Mass. 02466 under model numbers 4810 and 5810.

The probe 50 can be disposed on or carried by a mechanical arm (not shown) such that, under the control of the controller 48, the probe 50 can be moved over the mask 50 in multiple directions. By scanning the probe 50 over the mask 28, an elevation profile, or flatness profile, of the mask 28 can be derived. The flatness profile can be in the form of a topographical map, flatness signature or other data compilation such that variations in flatness of the mask 28 can be determined along with the relative locations of those thickness variations. For example, the probe 50 can be maintained at a constant voltage potential relative to the mask 28, where electrical charges can accumulate. As the distance between the probe 50 and the mask 28 varies, the amount of accumulated charge adjacent the gauge will vary, thereby producing a current that can be monitored. Since the monitored current is a function of the distance between the probe 50 and the upper surface of the mask 28, changes in calculated distance (as derived from the current measurement) can be attributed to changes in flatness and recorded by the controller 48.

It is noted that the mask 28 can be positioned relative to the chuck 38 such that the entire mask 28 contacts the chuck 38 or only a portion(s) of the mask 28 is brought into contact with the chuck 38. In addition, the mask 28 and/or the chuck 38 need not be round.

In one embodiment, the chuck 38 can have a mask mounting surface (sometimes referred to as a reference surface) that has less than 1 microrad local tilt over any 10×10 mm area. The chuck 38 can have a stiffness that is much greater than a stiffness of the mask 28 such that the mask 28 conforms to the chuck 38.

Figure 5:
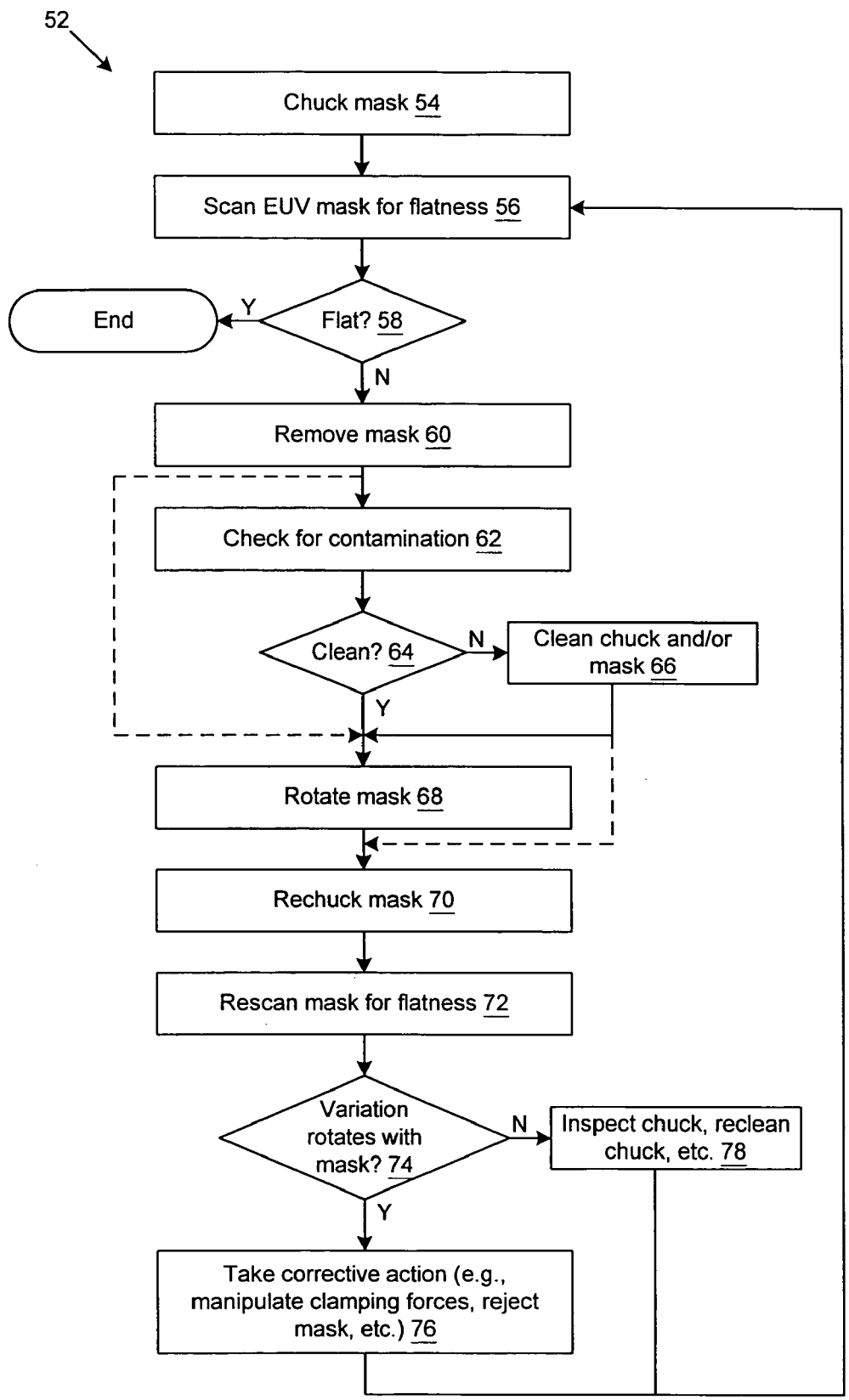
FIG. 5 is a flow diagram of an example technique for monitoring EUV lithography mask flatness.

With additional reference to FIG. 5 shown is a flow diagram of an example technique, or process 52, for monitoring EUV lithography mask flatness. The blocks of the illustrated process 52 can be thought of as depicting steps of a method. As should be appreciated, the blocks need not be carried out in the order shown and some blocks may be carried out concurrently or with partial concurrence. Also, additional blocks can be added and certain illustrated blocks can be omitted. For example, dashed lines are used to show example alternative paths through the illustrated process 52 and blocks skipped by the dashed lines can be ignored.

The process 52 applies to the use of the mask 28 as illustrated in FIG. 3 (e.g., the mask 28 being disposed in the integrated circuit processing assembly 20 for use in exposing the wafer 22). The process 52 also applies to other situations. Examples of other situations when the process 52 can be carried out include during inspection of the mask 28 such as in a registration metrology tool (not shown) and during fabrication of the mask such as in a mask writer tool (not shown).

The process 52 can start in block 54 where the mask 28 is "chucked." For example, the mask 28 can be brought into contact with the chuck 38 and the mask platen assembly 36 can be controlled to electrostatically hold the mask 28 to the chuck 38. In block 54 an initial, or default, set of electrostatic clamping forces can be applied to the mask 28 (e.g., clamping force of about 15±0.15 kPa).

The process 52 can proceed to block 56 where the mask 28 is scanned with the probe 50 to derive a flatness profile for the mask. As indicated, the flatness profile can include elevation values for various locations across the mask such that elevation differences in the mask 28 and the relative locations of those differences are known. The flatness profile can be derived for the entire mask area, or in alternative embodiments, for a portion of the mask area or selected positions of the mask 28.

After the mask 28 is scanned in block 56, the process can proceed to block 58 where the controller 48 determines if the mask 28 is flat, or has a sufficiently flat profile within a given tolerance parameter for the operation involving the mask 28 (e.g., illuminating the wafer 22, inspecting the mask 28, fabricating the mask 28, etc.). If the mask 28 is sufficiently flat, the process 52 can end and other processes involving the mask 28 can be commenced (e.g., illuminating the wafer 28, inspecting registration of the mask 28, writing the mask 28, etc.). Otherwise, the process 52 can proceed to block 60.

In block 60, the mask 28 can be removed from the chuck 38. Thereafter, in block 62, the chuck 38 and/or the mask 28 can be inspected for contamination, such as for the presence of a foreign body (e.g., a particle). If contamination is detected on the mask mounting surface of the chuck 38 in block 64, the chuck 38 can be cleaned using any appropriate technique in block 66. If contamination is detected on the upper or lower surface of the mask 28 in block 64, the mask 28 can be cleaned using any appropriate technique in block 66.

If contamination is not detected in block 64 or after cleaning has been carried out in block 66, the process 62 can proceed to block 68. In block 68, the mask 28 can be rotated with respect to the chuck 38. For example, the mask 28 can be turned about 90 degrees in either the clockwise direction or the counter-clockwise direction. However, other angles of rotation can be used such as from about 10 degrees to about 180 degrees in either the clockwise direction or the counter-clockwise direction.

Next, in block 70, the mask 28 can be rechucked. For example, the mask 28 (which is in the rotated position) can be brought into contact with the chuck 38 and the mask platen assembly 36 can be controlled to electrostatically hold the mask 28 to the chuck 38. In block 70 the initial, or default, set of electrostatic clamping forces can be applied to the mask 28. However, the clamping forces will interact with the mask 28, at new corresponding locations as depending on the angle of rotation in block 68.

The process 62 can then proceed to block 72 where the mask 28 is scanned a second time with the probe 50 to derive a second flatness profile for the mask 28. Similar to the first flatness profile, the second flatness profile can include elevation values for various locations across the mask such that elevation differences in the mask 28 and the relative locations of those differences are known. The second flatness profile can be derived for the entire mask area, or in alternative embodiments, for a portion of the mask area or selected positions of the mask 28.

Proceeding to block 74, the first and the second flatness profiles can be compared. If the variations in flatness rotated with the mask 28 (e.g., higher elevations points remained in the same location relative to the mask 28), then it can be concluded that the mask 28 is not flat. If the flatness profile rotated with the mask 28, then the process 52 can proceed to block 76 where a corrective action can be taken. An example corrective action includes manipulating the electrostatic clamping applied to the mask 28. For example, higher elevation points on the mask can be clamped with greater force than the initial force and/or other locations can be clamped with reduced force relative to the initial set of forces. Another example corrective action could include rejecting the mask 28 in favor of a new mask (or a new mask blank), especially in situations where several iterations through the process 52 have reached a conclusion that the mask is non-flat.

If, in block 74, the flatness profile did not rotate with the mask 28, then it can be concluded that a factor other than mask non-flatness may be causing or contributing to the "perceived" variations in mask flatness. Other factors can include, for example, contamination, chuck irregularities, defects in the electrostatic clamping mechanism, and so forth. Therefore, if the flatness variations did not rotate with the mask in block 74, the process 52 can proceed to block 78 where appropriate action can be taken. Example action that can be taken in block 78 include, for example, inspecting, cleaning, repairing, replacing and/or recalibrating the chuck 38 and/or mask platen assembly 36. The mask 28 could also be inspected, cleaned and/or replaced.

Following blocks 76 or 78, the process 52 can return to block 56, or block 54 if the mask 28 was removed in either of blocks 76 or 78. As previously indicated, alternatives to the illustrated process 52 that fall within the scope of the claims appended hereto can exist. At least two of those alternatives are illustrated using dashed lines in FIG. 5. For example, following block 60, the process can skip checking for contamination and/or cleaning of the chuck 38 and/or the mask 28, and proceed to block 68 where the mask 28 is rotated relative to the chuck 38. As an other example, following blocks 64 and/or block 66 (e.g., even if a positive ("Y") determination is made in block 64), the process 52 can proceed to block 70 where the mask 28 is re-chucked without rotating the mask 28. In this alternative, the comparison of block 74 can be performed directly (e.g., without consideration to the angular position of values from the second flatness profile with respect to the values from the first flatness profile).

Described above is a system and method for monitoring EUV lithography mask flatness for situations where the mask can be retained by a chuck in various devices, such as an exposure tool, a metrology tool or a writer tool. The system and method can contribute to achieving a satisfactory flatness of the EUV mask such that overlay errors present in a wafer exposed using the EUV mask can be minimized. Mask flatness is a driving factor in minimizing overlay errors since, in EUV lithography, the target overlay error budget for in-plane and out-of-plane errors due to mask mounting can be about 2.5 nm $3\sigma$ for exposure tools and about 2 nm $3\sigma$ for writer and metrology tools. In addition, the use of a first flatness profile scan and a second flatness profile scan can reduce the occurrence of false positive mask flatness errors (e.g., conclusions that the mask is non-flat where, in fact, another issue may be causing or contributing the flatness variation reading).

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of monitoring flatness of an extreme ultraviolet (EUV) lithography mask, comprising:
   chucking the EUV mask to a chuck;
   scanning the chucked EUV mask with a contactless capacitance probe to generate a first elevation data set for the EUV mask;
   generating a first flatness profile using the first elevation data set;
   comparing the first flatness profile against flatness tolerance parameters; and
   if the first flatness profile exceeds the flatness tolerance parameters:
   removing the EUV mask from the chuck;
   checking at least one of the EUV mask and the chuck for contamination;
   if contamination is present, cleaning a contaminated area; and
   rechucking the EUV mask to the chuck.

2. The method according to claim 1, further comprising:
   rescanning the EUV mask with the capacitance probe to generate a second elevation data set for the EUV mask; and
   generating a second flatness profile using the second elevation data set.

3. The method according to claim 2, further comprising comparing the first flatness profile and the second flatness profile.

4. The method according to claim 1, further comprising:
   rotating the EUV mask with respect to the chuck before rechucking the EUV mask;
   rescanning the rotated EUV mask with the capacitance probe to generate a second elevation data set for the EUV mask; and
   generating a second flatness profile using the second elevation data set.

5. The method according to claim 4, further comprising comparing the first flatness profile and the second flatness profile to determine if detected flatness variations rotated with the rotation of the EUV mask.

6. The method according to claim 5, further comprising adjusting a set of electrostatic clamping forces used to retain the EUV mask to the chuck if the detected flatness variations rotated with the rotation of the EUV mask.

7. The method according to claim 1, wherein the EUV mask is a reflective mask.

8. A system for monitoring flatness of an extreme ultraviolet (EUV) lithography mask, comprising:
   a mask platen assembly including a chuck with a mask mounting surface for receiving the EUV mask and electrostatically retaining the EUV mask to the chuck;
   a contactless capacitance probe for scanning the EUV mask to generate elevation data for the EUV mask; and
   a controller for receiving the elevation data and generating a flatness profile using the elevation data and for controlling the electrostatic clamping forces of the mask platen assembly, wherein the controller executes logic to:
   conduct a first scan of the EUV mask while chucked to generate a first flatness profile and, following a rotation of the EUV mask with respect to the chuck, conduct a second scan of the EUV mask while chucked to generate a second flatness profile; and
   compare the first flatness profile and the second flatness profile to determine if detected flatness variations rotated with the rotation of the EUV mask.

9. The system according to claim 8, wherein the controller executes logic to adjust a set of electrostatic clamping forces used to retain the EUV mask to the chuck if the detected flatness variations rotated with the rotation of the EUV mask.

10. The system according to claim 8, wherein the EUV mask is a reflective mask.

* * * * *